United States Patent [19]

Kobayashi

[11] Patent Number: 5,162,749

[45] Date of Patent: Nov. 10, 1992

[54] AMPLIFIER CIRCUIT HAVING A FEEDBACK CIRCUIT

[75] Inventor: Osamu Kobayashi, Yokohama, Japan

[73] Assignee: Fujitsu Limited, Kawasaki, Japan

[21] Appl. No.: 611,695

[22] Filed: Nov. 13, 1990

[30] Foreign Application Priority Data

Nov. 10, 1989 [JP] Japan .................. 1-293728

[51] Int. Cl.$^5$ .............................................. H03F 3/45
[52] U.S. Cl. .................... 330/253; 330/260; 330/277; 330/311
[58] Field of Search ................ 330/253, 260, 277, 311

[56] References Cited

U.S. PATENT DOCUMENTS 3,922,614  11/1975  van de Plassche ................ 330/253
4,912,425  3/1990   Kobayashi ......................... 330/253

Primary Examiner—Eugene R. LaRoche
Assistant Examiner—R. A. Ratliff
Attorney, Agent, or Firm—Staas & Halsey

[57] ABSTRACT

An amplifier circuit is provided with first to third amplifying stages, a constant current source and a feedback circuit. The minimum value of current flowing through the output-stage transistor of the amplifier circuit is limited chiefly by the action of the feedback circuit. This prevents the output-stage transistor from becoming cut off, even when an excessive input signal is applied and high-speed circuit operation is realized. Also, a maximum value of current flowing through the output-stage transistor is limited so as to prevent an excessive output current. This will realize protection of the amplifier circuit against overcurrent.

8 Claims, 7 Drawing Sheets

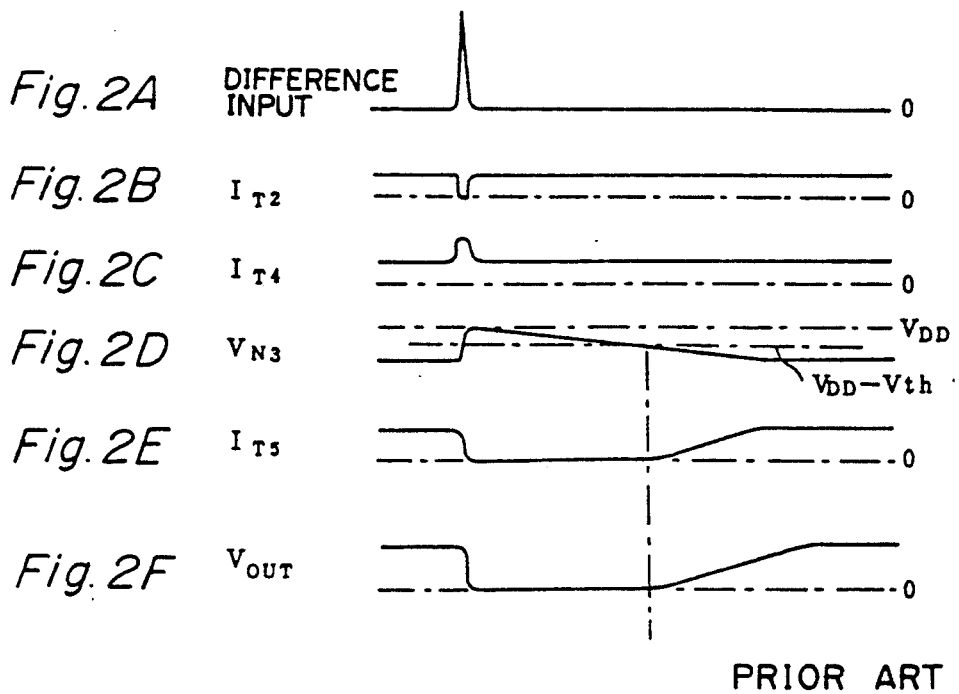
PRIOR ART
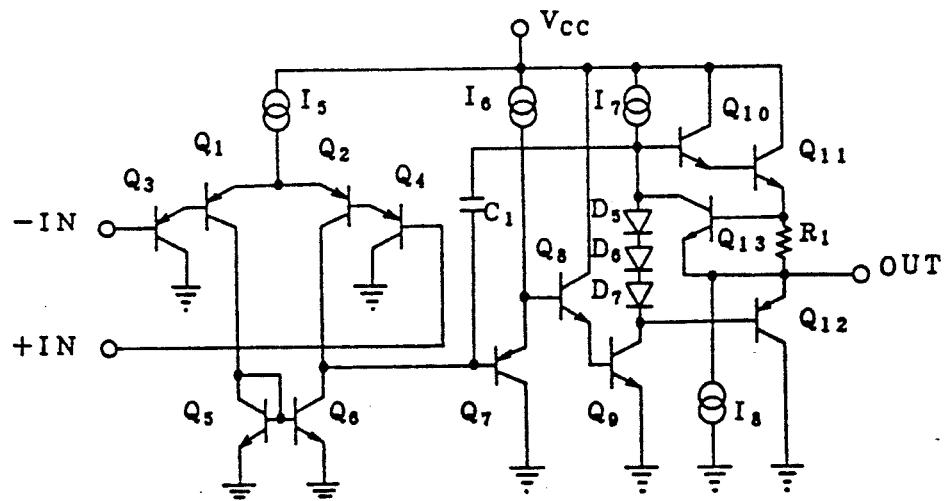
PRIOR ART
Fig. 4

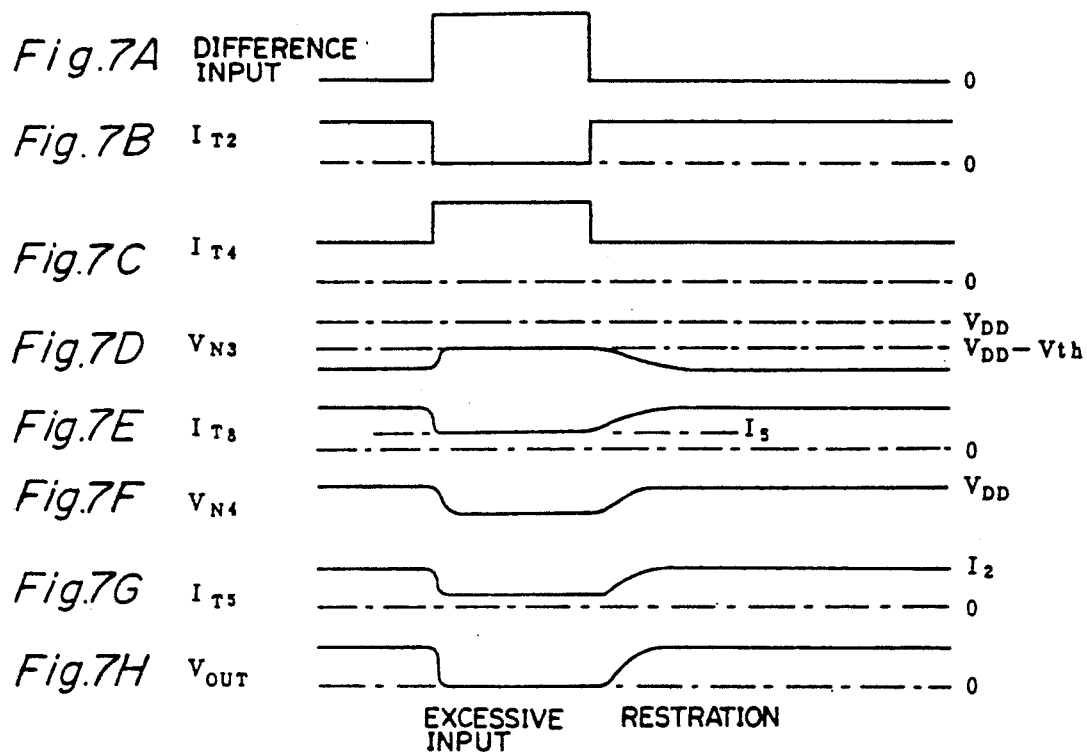
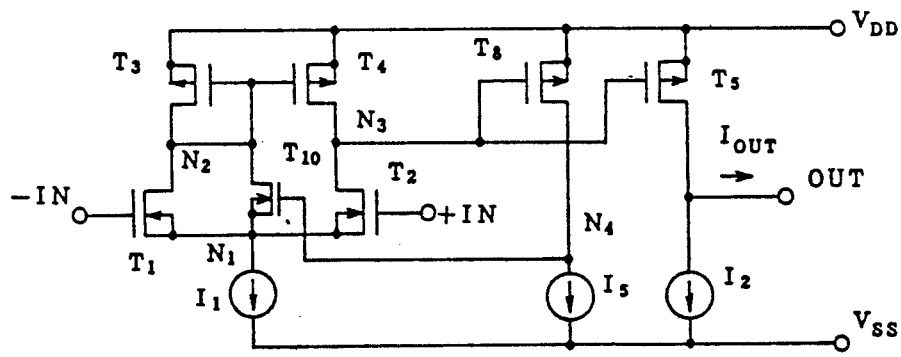
Fig. 8

AMPLIFIER CIRCUIT HAVING A FEEDBACK CIRCUIT

BACKGROUND OF THE INVENTION

1. Technical Field

The present invention relates to an amplifier circuit for high-speed operation, which is protected from excess current.

Recently, there has been increasing demand for a high-speed large-scale integrated circuit which is capable of handling a large current for driving a peripheral circuit. Demand exists for an analog LSI as well as a digital LSI. It is necessary to speed up the operation of an analogue circuit and to drive it with a large current. Thus, an amplifier such as an operation amplifier must be speeded up or subjected to a large current drive. It is necessary to drive the analog circuit with a large current. Thus, the LSI itself and the peripheral circuit must be protected from an excess current upon an excess load such as a load short-circuit by a current-limiting function provided to the LSI itself or to the peripheral circuit.

2. Related Art

FIG. 1 shows an example of a differential amplifier circuit (such as a comparator) composed of a CMOS. $T_1$ and $T_2$ are a pair of differential N-channel driving transistors and $T_3$ and $T_4$ form a current mirror circuit by using a P-channel load transistor. $T_5$ is a P-channel transistor in the output stage and $I_1$ and $I_2$ are constant current sources. +IN and −IN, respectively, are the non-inverting and inverting inputs, and OUT is the output.

In this differential amplifier circuit, $T_1$ turns on and $T_2$ turns off when $-IN > +IN$. Thus, the voltage level of node $N_3$ then increases, thereby turning $T_5$ off and providing the output OUT with L level. Conversely, $T_1$ turns off and $T_2$ turns on when $-IN < +IN$. Thus, the voltage level of node $N_3$ decreases, thereby turning $T_5$ on and providing output OUT with H level. When the transistor operates in saturation region, the above recited ON state means that a current larger than the standard operating point current is caused to flow and the OFF state means that a current smaller than the standard operating point current is caused to flow.

As shown in FIG. 2A, when an excess difference input voltage $V_{(-IN)} - V_{(+IN)}$ is applied to this circuit, $T_1$ turns on and $T_2$ turns off, thereby enabling transistor $T_1$ to cause a whole output current of a constant current source $I_1$ to flow and enabling transistor $T_2$ to cause a current $I_{T2}$ to be 0. The current of transistor $T_1$ is equal to that of transistor $T_3$, and $T_3$ and $T_4$ form a current mirror circuit. Thus, the current of $T_4$ is proportional to the current of $T_3$ (the current of $T_4$ is the same as the that of $T_3$.) Accordingly, the current $I_{T4}$ of transistor $T_4$ tends to increase as shown in FIG. 2C, but the current $I_{T4}$ can not flow as transistor $T_2$ is turned off. Transistor $T_4$ is strongly driven and the voltage drop between the drain and source becomes almost 0. Thus, the potential $V_{N3}$ of node $N_3$ increases to the source voltage $V_{DD}$. Thus, transistor $T_5$ turns off and the output voltage $V_{OUT}$ becomes equal to the voltage $V_{SS}$ (which is 0 Volts in this embodiment).

If the excess difference input ends instantaneously as shown in FIG. 2A, and thereafter the input difference becomes 0, transistors $T_1$ and $T_2$ turn on and cause $I_1/2$ to flow. This $I_1/2$ is equal to the current caused to flow by transistors $T_3$ and $T_4$. Node $N_3$ is driven at the voltage $V_{DD}$ by the excess difference input. When the difference input is 0, the voltage decreases more. However, when $I_{T4}$ is equal to $I_{T2}$, it takes time for node $N_3$ to discharge the charge therein. Thus, the potential $N_3$ of node $N_3$ gradually decreases, as shown in FIG. 2D. When the voltage $V_{N3}$ is less than $V_{DD}-V_{th}$ (where $V_{th}$ is the threshold voltage of transistor $T_5$), transistor $T_5$ turns on, thereby causing the current $I_{T5}$ to flow and voltage $V_{OUT}$ to increase.

As stated above, if an excess input is applied to the amplifier, the internal voltage of the amplifier deviates from its normal operation and takes time to be restored. Thus, it can not perform a normal operation within a restoring period, and high-speed operation is not achieved.

To solve this problem, the prior art is provided with the countermeasure shown in FIG. 3. In FIG. 3A, diodes $D_1$ and $D_2$ of reverse parallel connection are connected between nodes $N_2$ and $N_3$, thus limiting the amplitude of the potential of node $N_3$ and tending to produce high-speed operation. The limitation of the amplitude when the potential of node $N_3$ tends to increase to the voltage $V_{DD}$, can only be performed by diode $D_1$. In FIG. 3B, the current sources $I_3$ and $I_4$ are inserted between the nodes $N_2$ to $N_3$ and the low potential side source $V_{SS}$ to prevent transistors $T_3$ and $T_4$ from being in a non-current state when transistors $T_1$ or $T_2$ are cut off by the excess input and to prevent the potential increase in nodes $N_2$ and $N_3$ from being excessive. In FIG. 3C, transistors $T_6$ and $T_7$ are connected between the nodes $N_2$ and $N_3$ and node $N_1$, and transistors $T_6$ and $T_7$ are controlled by −IN and +IN so that $T_7$ is on when $T_1$ is off and $T_6$ is on when $T_2$ is off, thereby preventing transistors $T_3$ and $T_4$ from being in a non-current state and preventing an excess potential increase in nodes $N_2$ and $N_3$. The same parts are represented by the same symbols throughout the all drawings.

However, in the circuit shown in FIG. 3A, the CMOS IC should be formed of a MOS diode. When the CMOS IC is formed of junction type diodes $D_1$ and $D_2$, a parasitic thyristor is formed, causing latch up phenomena. The circuits shown in FIGS. 3B and 3C do not perform an amplitude limitation directly. Thus, they can not achieve a sufficient effect and can not perform a sufficient high speed operation.

Next, the excess current is discussed. If a load short-circuit occurs, an excess output current flows and the transistor in the output stage is destroyed. In a small-current FET, a load short-circuit does not cause a great problem as the load current is suppressed because of the saturation characteristic of a small current FET, but a circuit having a large current-driving capability has the problem of a load short-circuit.

FIG. 4 shows an example of a circuit in which an excess current is prevented by using an emitter-follower. $Q_1$ to $Q_6$ are bipolar transistors forming a differential pair at the input stage. The non-inverting and inverting inputs +IN and −IN are applied to the bases of transistors $Q_4$ and $Q_3$. Transistors $Q_5$ and $Q_6$ form a current mirror. $I_5-I_8$ form a constant current source, bipolar transistors $Q_{10}-Q_{12}$ form an output stage, $Q_7-Q_9$ form the driving stage, $C_1$ is a phase compensation capacitor, $R_1$ is a current sensing resistor, $D_5-D_7$ are level shifting diodes, and $Q_{13}$ is a bipolar transistor. Resistor $R_1$ and transistor $Q_{13}$ prevent an excess current.

When the load current increases and hence the voltage drop across the resistor $R_1$ increases, transistor $Q_{13}$ is be turned on, and the base current of the Darlington pair $Q_{10}$ and $Q_{11}$ is bypassed. As a result, transistors $Q_{10}$ and $Q_{11}$ are driven in the direction such that they are turned off and the load current is prevented from becoming excessive. More specifically, when an external load is supplied at a current I from the output terminal OUT, the current I is mainly supplied through $Q_{11}$ and $R_1$. When the current I increases and hence the voltage drop $IR_1$ across the resistor $R_1$ exceeds $V_{BEO}$ (the specific base-to-emitter voltage of approximately 0.6–0.7 volts) of the transistor $Q_{13}$, the transistor $Q_{13}$ will begin to conduct. Then, the base voltage of $Q_{10}$ and hence the base voltage of $Q_{11}$ will be decreased and the emitter voltage of $Q_{11}$ and the output voltage at OUT will be subsequently decreased, thereby reducing the supply current I to the external load. Finally, the current I will be limited to a level which satisfies $IR_1 \approx 0.6$–$0.7$ volts (in other words, to the extent that $Q_{13}$ begins to conduct a current).

The circuit of FIG. 4, which performs a current limiting function, is a bipolar transistor circuit, not a CMOS circuit. With a CMOS amplifier, a source follower does not have as low an impedance as an emitter follower of a bipolar amplifier. Thus, a CMOS circuit corresponding the circuit of FIG. 4 is not used. In a CMOS configuration, the currents of transistor $T_5$ and current source $I_2$ are made high in FIG. 1, thereby providing high-current driving capability.

With the system of FIG. 3A adapted to speed up the operation of the CMOS amplifier, there are problems with the protection diodes $D_1$ and $D_2$. With the systems of FIGS. 3B and 3C, on the other hand, a sufficient effect cannot be expected. There is a bipolar transistor amplifier sufficient for overcurrent limiting, as shown in FIG. 4, but there is no satisfactory CMOS amplifier.

SUMMARY OF THE INVENTION

It is therefore an important object of the present invention to provide an amplifier circuit which is adapted for high-speed circuit operation and overcurrent prevention.

A feature of the present invention resides in an amplifier circuit comprising; a first amplifying stage for receiving an input signal and amplifying it to provide an output signal, a second amplifying stage for receiving the output signal of the first amplifying stage and amplifying it to provide an output signal, a third amplifying stage for receiving the output signal of the first amplifying stage and having its output terminal connected to a constant current source, and a feedback circuit connected between the junction of the third amplifying stage and the constant current source and the first amplifying stage, the ratio of an output current of the second amplifying stage to that of the third amplifying stage being fixed and the feedback circuit controlling the output of the first amplifying stage only when the potential at the junction of the third amplifying stage and the constant current source is either above or below a specified potential.

BRIEF DESCRIPTION OF THE DRAWINGS

FIGS. 2A through 2F are diagrams which illustrate the operation of the amplifier circuit shown in FIG. 1;

FIG. 4 is a circuit diagram of a conventional bipolar transistor amplifier circuit adapted for overcurrent protection;

FIGS. 7A through 7H are diagrams which illustrate the operation of the amplifier circuit shown in FIG. 6;

FIG. 8 is a circuit diagram of an amplifier circuit according to the second embodiment of the present invention;

DETAILED DESCRIPTION OF THE PREFERRED EMBODIMENTS

Figure 5:
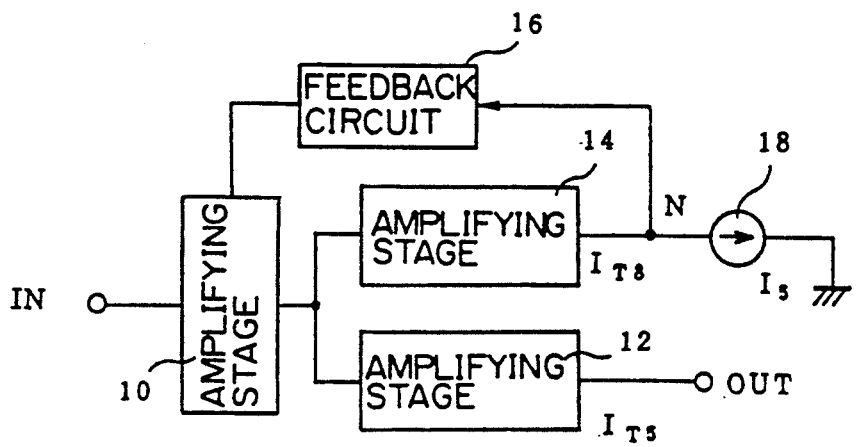
FIG. 5 is a basic block diagram illustrating the principle of the present invention.

As illustrated in FIG. 5, the amplifier circuit of the present invention is composed of three amplifying stages 10, 12 and 14; a constant current source 18; and a feedback circuit 16.

The first amplifying stage 10 receives an input signal IN and provides an output signal to the second and third amplifying stages 12 and 14. The output of the second amplifying stage 12 is used as the output OUT of the present amplifier circuit. The output of the third amplifying stage 14 is connected to inputs of the constant current source 18 and the feedback circuit 16. The output of the feedback circuit 16 is connected to the first amplifying stage 10.

The second and third amplifying stages 12 and 14 are set such that their output currents are in a constant ratio. The feedback circuit 16 is adapted to control the first amplifying stage 10 only when the input signal of the feedback circuit 16 is above or below a fixed level. The first and third amplifying stages 10 and 14, the constant current source 18 and the feedback circuit 16 form a negative feedback control system.

In the amplifier circuit, the input signal IN is amplified by the amplifying stages 10 and 12 to provide the output OUT, and the output of the amplifying stage 10 is controlled by the negative feedback control system including the amplifying stage 14.

The output signals of the amplifying stages 12 and 14 are obtained in terms of current and the output currents are in a fixed ratio. The voltage at node N, which is the junction of the amplifying stage 14 and the constant current source 18, is determined by the difference between the output current of the amplifying stage 14 and the current of the constant current source 18. The feedback circuit 16 feeds the voltage at the node N back to the amplifying stage 10, thereby controlling the output of the amplifier 10 only when the voltage at node N is higher or lower than a fixed voltage.

Assuming that the output currents of the amplifying stages 12 and 14 are $I_{T5}$ and $I_{T8}$, respectively, $I_{T5}$ and $I_{T8}$ are related by : $I_{T5} = A\, I_{T8}$ where A is a constant. Assuming that the current of the constant current source 18 is $I_5$ and the voltage at the node N is V, V becomes high when $I_{T8} - I_5 > 0$, and low when $I_{T8} - I_5 < 0$. When V is high, the feedback circuit 16 limits the maximum value of current drawn from the output OUT, thereby preventing overcurrent or preventing the current-sinking transistor of the amplifying stage 12 from becoming cut off, thereby achieving high-speed circuit operation. When V is low, on the other hand, the feedback circuit limits the maximum value of sink current, thereby preventing overcurrent or preventing the output-stage transistor of the amplifying stage 12 from being cut off, thereby achieving high-speed circuit operation.

Figure 1:
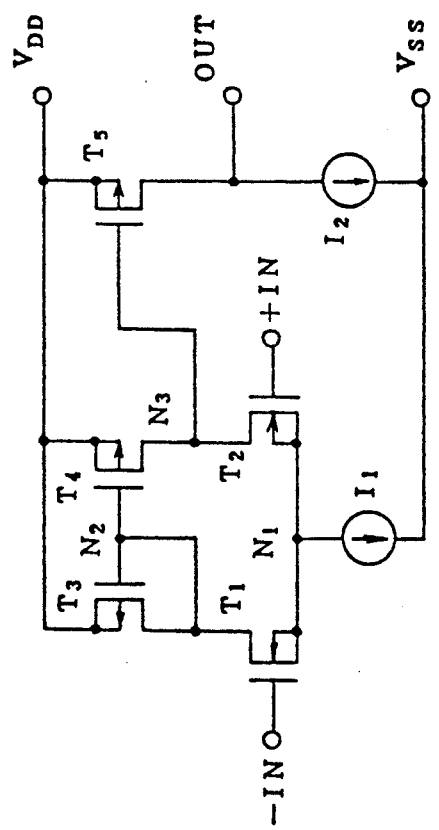
FIG. 1 is a circuit diagram of a conventional CMOS amplifier circuit.
Figure 3A:
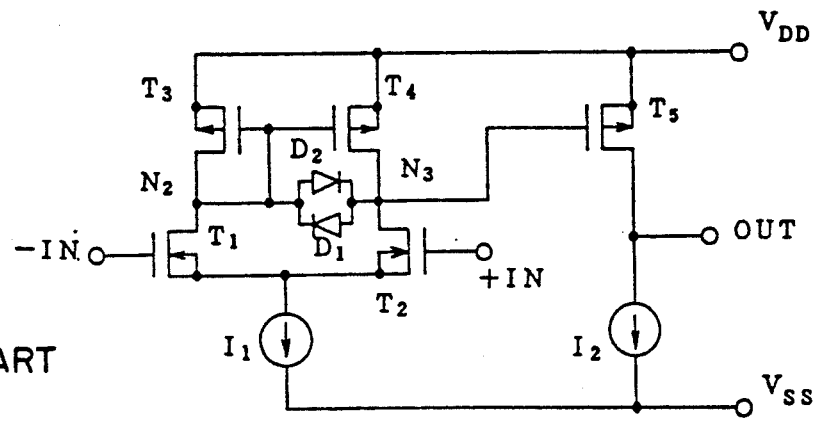
FIGS. 3A through 3C are circuit diagrams of conventional CMOS amplifier circuits adapted for high-speed circuit operation.
Figure 3B:
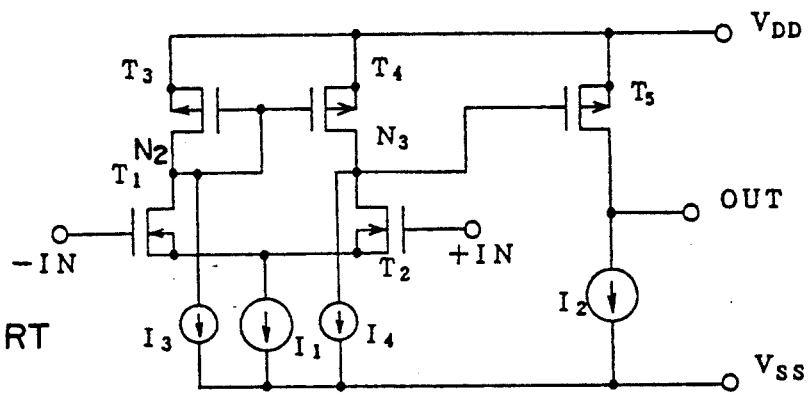
Figure 3C:
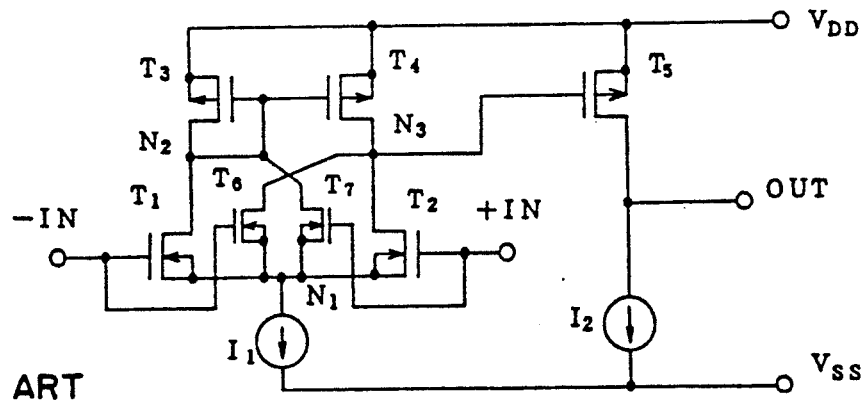
Figure 6:
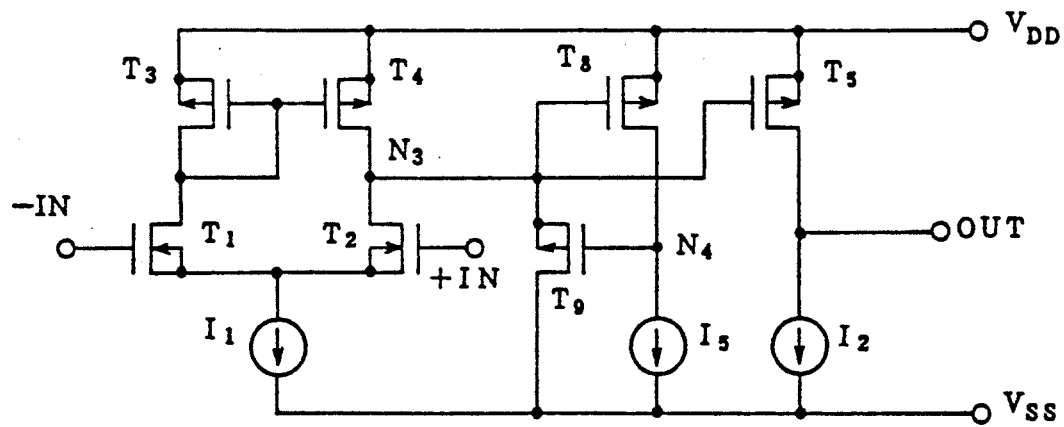
FIG. 6 is a circuit diagram of an amplifier circuit according to the first embodiment of the present invention.
Figure 10:
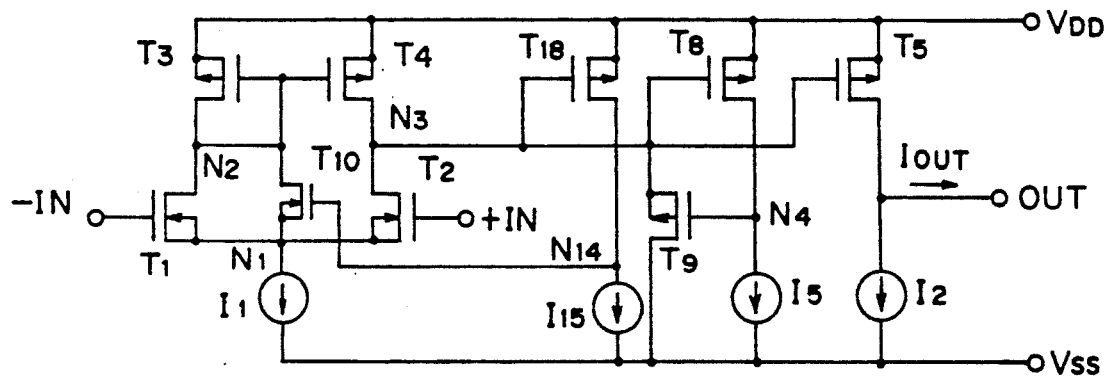
FIG. 10 is a circuit diagram of an amplifier circuit according to the third embodiment of the present invention.

FIGS. 6, 8 and 10 illustrate the first, second and third embodiments of the present invention, respectively. Comparisons of these Figures with FIG. 1 show that each has a P-channel transistor $T_8$ and a constant current source $I_5$ added to it. A P-channel transistor $T_9$ is further added to the circuit in FIG. 6; an N-channel transistor $T_{10}$ to the circuit in FIG. 8; and P-channel transistors $T_9$ and $T_{18}$, an N-channel transistor $T_{10}$ and a constant current source $I_{15}$ to the circuit in FIG. 10. $T_1$ through $T_4$ and $I_1$ form the amplifying stage 10 of FIG. 5, $T_5$ and $I_2$ form the amplifying stage 12, $T_8$ and $T_{18}$ form the amplifying stage 14, and $I_5$ and $I_{15}$ form the constant current source 18. $T_9$ in FIG. 6, $T_{10}$ in FIG. 8 and $T_9$ and $T_{10}$ in FIG. 10 each correspond to the feedback circuit 16 of FIG. 5.

The first embodiment, illustrated in FIG. 6, is adapted to prevent the output-stage transistor $T_5$ from becoming cut off, thereby achieving high-speed circuit operation. The operation of the first embodiment is described below with reference to FIGS. 7A through 7H.

In the circuit of FIG. 6, the currents of $I_2$ and $T_5$ are normally equal when OUT is midway between $V_{DD}$ and $V_{SS}$. Since they have the same characteristics, transistors $T_5$ and $T_8$ will conduct the same current $I_2$. Since $I_5$ and $I_2$ are set such that $I_5<I_2$, the potential at node $N_4$ is raised to a level in the neighborhood of $V_{DD}$. Therefore, $T_9$ is normally turned off.

As in the circuit of FIG. 1, when excessively different input signals such as those illustrated in FIG. 7A are applied in a direction to cause $V_{(+IN)}<V_{(-IN)}$, transistor $T_1$ will be turned on, while transistor $T_2$ will be turned off. Thus, the voltage drop across $T_4$ decreases so that the potential at $N_3$ approaches $V_{DD}$ as transistors $T_3$ and $T_4$ of the current mirror circuit are driven to cause a current $I_1$ to flow. This decreases the currents of $T_5$ and $T_8$ so that the output voltage at OUT decreases immediately, as shown in FIG. 7H, and after some delay the current $I_{T8}$ of $T_8$ becomes smaller than $I_5$, as shown in FIG. 7E. Consequently, the potential $V_{N4}$ at $N_4$ will also be lowered, as shown in FIG. 7F. When the potential $V_{N4}$ at $N_4$ becomes lower than the potential $V_{N3}$ at $N_3$ by at least the the threshold voltage $V_{th}$ of the transistor $T_9$, $T_9$ will begin to conduct so that current flows from $N_3$ to $V_{SS}$. At this point the elevation of the potential at $N_3$ is stopped. In this state, transistors $T_8$ and $T_5$ each conduct the current $I_5$. That is, they are not in the cut-off state. Thus, when the excessive input is removed, the amplifier circuit can immediately prepare to accommodate the next input signal.

In the conventional circuit illustrated in FIG. 1, when an excessive input signal is applied, $T_5$ is placed in the cut-off state so that, even if the excessive input signal is removed, no response can be made until $T_5$ gets out of the cut-off state. However, the circuit of the present embodiment can attain remarkable high-speed circuit operation because $T_5$ and $T_8$ are not cut off even when an excessive input signal is applied. Thus, when the excessive input signal is removed, the circuit can immediately prepare to accommodate the next input signal.

Note, that the gain factors $\beta 5$ and $\beta 8$ of transistors $T_5$ and $T_8$ are set to satisfy $\beta 5/\beta 8 = A/1$, and $I_5 = I_2/A - \alpha < I_2/A$. Here, A may be either $A \geq 1$ or $A \leq 1$, and $\alpha$ may be any value that satisfies $0 < \alpha < I_2/A$.

Next, the second embodiment, shown in FIG. 8, is adapted to limit the current of the output-stage transistor $T_5$ to protect the circuit against overcurrent.

Figure 9:
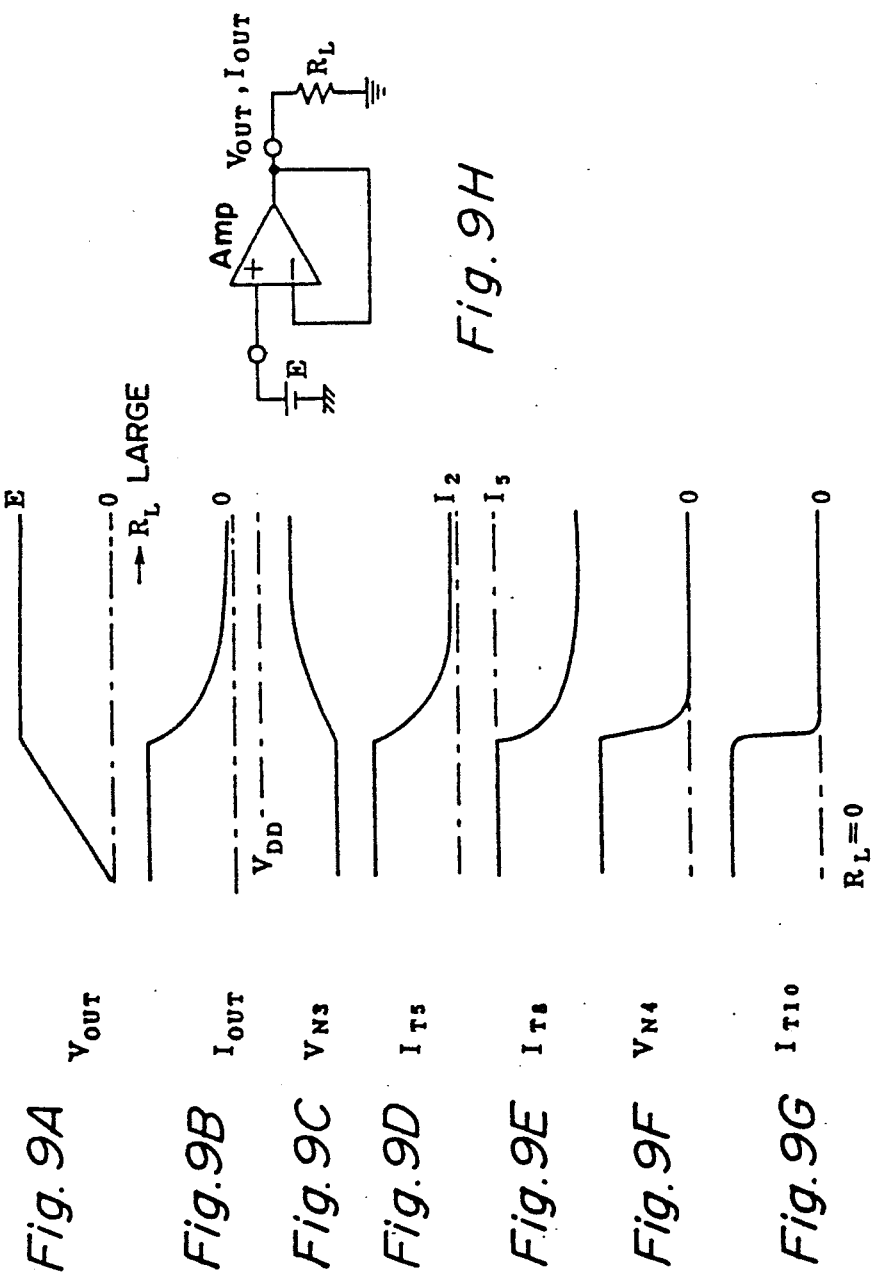
FIGS. 9A through 9H are diagrams which illustrate the operation of the amplifier circuit shown in FIG. 8.

As illustrated in FIG. 9H, the amplifier circuit of the present embodiment may be considered to have a configuration in which feedback is provided to an amplifier having the same arrangement as the circuit of FIG. 1 through transistors $T_8$ and $T_{10}$ and the constant current source $I_5$. In this case, the amplifier operates so as to hold its output voltage $V_{OUT}$ constant even if a variation occurs in a load ($R_L$, $I_{OUT}$, etc.). That is, when $R_L$ becomes small so that $I_{OUT}$ increases and $V_{OUT}$ decreases, the $-IN$ voltage of FIG. 8 ($=V_{OUT}$) also decreases. Thus, the current of $T_1$ ($=$ the current of $T_3=$ the current of $T_4$) decreases and the current of $T_2$ increases. As a result, the potential at $N_3$ falls. Then, the current of $T_5$ increases, thereby preventing $V_{OUT}$ from decreasing.

Assuming that $T_8$ and $T_5$ have the same characteristics and $I_5>I_2$, since normally $I_{T8}=I_{T5}=I_2<I_5$, the voltage of $N_4$ is in the neighborhood of $V_{SS}$ and thus $T_{10}$ is turned off. When $I_{OUT}$ increases, it is limited to a fixed value as shown in FIGS. 9A through 9G. That is, when $I_{OUT}$ increases and thus $I_{T5}$ ($=I_{T8}$) increases, resulting in $I_{T8} \geq I_{T5}$, the potential at $N_4$ rises. When the potential at $N_4$ becomes higher than that at $N_1$ by at least the threshold voltage $V_{th}$ of $T_{10}$, $T_{10}$ conducts, causing current to flow in $T_3$ and $T_4$. Thus, the potential at $N_3$ is raised, thereby preventing the currents of $T_5$ and $T_8$ from increasing further. As a result, $I_{OUT}$ is limited.

Thus, according the present embodiment, satisfactory overcurrent protection can also be realized by a CMOS amplifier circuit.

The third embodiment, illustrated in FIG. 10, is adapted to keep the output-stage transistor $T_5$ from becoming cut off and to limit the current to simultaneously realize high-speed circuit operation and overcurrent protection.

As shown in FIG. 10, the circuit of the present embodiment combines the circuits of FIG. 6 and FIG. 8. That is, $T_8$, $T_9$, $N_4$ and $I_5$ in FIG. 10 are adapted to high-speed circuit operation and correspond to $T_8$, $T_9$, $N_4$ and $I_5$, respectively, in FIG. 6. Also, $T_{18}$, $T_{10}$, $N_{14}$ and $I_{15}$ in FIG. 10, are adapted to overcurrent protection and correspond to $T_8$, $T_{10}$, $N_4$ and $I_5$, respectively, in FIG. 8.

The operation of the present embodiment may also be considered to be a combination of the operations of the embodiments shown in FIG. 6 and FIG. 8. That is, when $-IN > +IN$, $T_5$ is cut off. However, $T_5$ is prevented from becoming cut off by the same operation as in the circuit of FIG. 6, thus enabling fast recovery. In addition, even if the output current $I_{OUT}$ increases, it will be limited by the same operation as the circuit of FIG. 8.

The above embodiments are directed to only CMOS amplifier circuits. However, the amplifier circuits of the present invention may be composed of bipolar transistors only. In this case, it is necessary only that the N-channel MOS transistors be replaced with NPN bipolar transistors and the P-channel MOS transistors be replaced with PNP bipolar transistors. In operation as well, the amplifier circuits using bipolar transistors are the same as the corresponding CMOS amplifier circuits illustrated in the drawings and described above.

As described above, according to the present invention, a minimum value and/or a maximum value of current in the output stage transistor of an amplifier circuit can be limited, thereby achieving fast recovery after application of an excessive input signal. This is because the output transistor is prevented from becoming cut off and/or because the circuit is protected by output current limitation.

What is claimed is:

1. An amplifier circuit, comprising:
   a first amplifying stage to receive and amplify an input signal to provide a first output signal;
   a second amplifying stage operatively connected to said first amplifying stage to receive and amplify the first output signal to provide a second output signal;
   a third amplifying stage operatively connected to said second amplifying stage to receive and amplify the second output signal and to provide a third output signal, and having an output terminal operatively connected to a constant current source at a junction, wherein the third output signal has a predetermined current ratio with the second output signal of said second amplifying stage; and
   a feedback circuit, operatively connected between the junction and said first amplifying stage, including means for controlling the output of said first amplifying stage only when a potential at the junction is either above or below a predetermined potential.

2. The amplifier circuit according to claim 1, in which said first amplifying stage, said third amplifying stage and said feedback circuit form a negative feedback loop.

3. The amplifier circuit according to claim 2, in which said negative feedback loop is arranged to limit the minimum current flowing through an output stage transistor contained in said second amplifying stage, thereby preventing said output stage transistor from becoming cut off.

4. The amplifier circuit according to claim 2, in which said negative feedback loop is arranged to limit the maximum current flowing through an output stage transistor contained in said second amplifying stage, thereby preventing an excessive output current.

5. The amplifier circuit according to claim 2, in which said negative feedback loop is arranged to limit the minimum current flowing through an output stage transistor contained in said second amplifying stage, thereby preventing said output stage transistor from becoming cut off, and to limit a maximum value of current flowing through said output stage transistor, thereby preventing an excessive output current.

6. An amplifier circuit according to claim 5, in which said first amplifying stage is provided with a pair of transistors forming a current mirror and a differential pair of transistors.

7. An amplifier circuit according to claim 6, in which transistors contained in said first, second and third amplifying stages and said negative feedback circuit are MOS transistors.

8. An amplifier circuit according to claim 6, in which transistors contained in said first, second and third amplifying stages and said negative feedback circuit are bipolar transistors.

* * * * *